United States Patent
Minemura

(10) Patent No.: US 12,157,702 B2
(45) Date of Patent: Dec. 3, 2024

(54) CERAMIC SUBSTRATE AND ELECTROSTATIC CHUCK

(71) Applicant: SHINKO ELECTRIC INDUSTRIES CO., LTD., Nagano (JP)

(72) Inventor: Tomotake Minemura, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 716 days.

(21) Appl. No.: 17/167,375

(22) Filed: Feb. 4, 2021

(65) Prior Publication Data

US 2021/0246071 A1  Aug. 12, 2021

(30) Foreign Application Priority Data

Feb. 7, 2020  (JP) .................... 2020-019825

(51) Int. Cl.
| | |
|---|---|
| C04B 35/10 | (2006.01) |
| C04B 41/50 | (2006.01) |
| C04B 41/51 | (2006.01) |
| C04B 41/87 | (2006.01) |
| C04B 41/88 | (2006.01) |
| H01L 21/48 | (2006.01) |
| H01L 21/683 | (2006.01) |
| H02N 13/00 | (2006.01) |

(52) U.S. Cl.
CPC .......... *C04B 35/10* (2013.01); *C04B 41/5025* (2013.01); *C04B 41/51* (2013.01); *C04B 41/87* (2013.01); *C04B 41/88* (2013.01); *H01L 21/4807* (2013.01); *H01L 21/6833* (2013.01); *H02N 13/00* (2013.01); *C04B 2235/32* (2013.01); *C04B 2235/3418* (2013.01); *C04B 2237/68* (2013.01)

(58) Field of Classification Search
CPC ...... C04B 35/10; C04B 41/88; H01L 21/6833
See application file for complete search history.

(56) References Cited

U.S. PATENT DOCUMENTS

| | | | | |
|---|---|---|---|---|
| 2002/0075624 | A1* | 6/2002 | Wang | .................. H01L 21/6831 361/234 |
| 2010/0227145 | A1* | 9/2010 | Teratani | ................ C04B 35/117 428/220 |

(Continued)

FOREIGN PATENT DOCUMENTS

| | | |
|---|---|---|
| CN | 107438885 A | 12/2017 |
| JP | H04-331779 | 11/1992 |

(Continued)

OTHER PUBLICATIONS

Japanese Office Action dated Feb. 7, 2023 issued in corresponding Japanese application No. 2020-019825; English machine translation included (8 pages).

(Continued)

*Primary Examiner* — Scott Bauer
(74) *Attorney, Agent, or Firm* — Rankin, Hill & Clark LLP

(57) ABSTRACT

A ceramic substrate includes a substrate main body, and a conductor layer provided inside of the substrate main body. The substrate main body includes an insulator layer that is ceramics composed of aluminum oxide, and a composite oxide layer of aluminum and silicon, the composite oxide layer being formed between the insulator layer and the conductor layer.

19 Claims, 22 Drawing Sheets

(56) References Cited

U.S. PATENT DOCUMENTS

| | | | |
|---|---|---|---|
| 2014/0071582 A1 | 3/2014 | Anada et al. | |
| 2014/0285943 A1* | 9/2014 | Watanabe | H01L 21/6833 361/234 |
| 2017/0057875 A1* | 3/2017 | Ishizuka | C04B 35/78 |
| 2017/0162416 A1 | 6/2017 | Miyazawa et al. | |
| 2018/0076343 A1 | 3/2018 | Schulz et al. | |
| 2020/0035469 A1* | 1/2020 | Momiyama | H01L 21/68757 |
| 2020/0253045 A1 | 8/2020 | Kirikihira et al. | |
| 2020/0303205 A1* | 9/2020 | Chae | H01L 21/67103 |

FOREIGN PATENT DOCUMENTS

| | | |
|---|---|---|
| JP | H06-290635 | 10/1994 |
| JP | 2005-286107 A | 10/2005 |
| JP | 2017-103389 A | 6/2017 |
| JP | 2020-004749 A | 1/2020 |
| TW | 1468362 B | 1/2015 |

OTHER PUBLICATIONS

Chinese Office Action dated Mar. 31, 2023, Chinese Application No. 202110162469.5, English translation included, 20 pages.

Japanese Office Action dated Feb. 6, 2024, Application No. 2023-060118; English translation included, 10 pages.

Taiwanese Office Action dated May 31, 2024 issued in corresponding Taiwanese application No. 01331/11320553500; English translation included (11 pages).

\* cited by examiner

CERAMIC SUBSTRATE AND ELECTROSTATIC CHUCK

CROSS-REFERENCE TO RELATED APPLICATIONS

This application is based upon and claims the benefit of priority from prior Japanese patent application No. 2020-019825, filed on Feb. 7, 2020, the entire contents of which are incorporated herein by reference.

TECHNICAL FIELD

The present invention relates to a ceramic substrate and an electrostatic chuck.

BACKGROUND ART

In the related art, a semiconductor manufacturing apparatus for treating a substrate such as a semiconductor wafer includes an electrostatic chuck configured to hold the semiconductor wafer. The semiconductor manufacturing apparatus is, for example, a film formation apparatus such as a CVD apparatus and a PVD apparatus, a plasma etching apparatus, and the like. The electrostatic chuck includes a mounting stage for the ceramic substrate and a conductor pattern arranged in the mounting stage, and holds the substrate on the mounting stage by using the conductor pattern as an electrostatic electrode. The conductor pattern is formed by co-firing a conductive paste including a high-melting point material such as tungsten and the ceramic substrate (for example, refer to PTLs 1 and 2). Note that, a ceramic substrate for a semiconductor device is also formed in a similar manner.

CITATION LIST

Patent Literature

[PTL 1] JP-A-H04-331779
[PTL 2] JP-A-H06-290635

The electrostatic chuck is formed by printing the conductive paste on a green sheet and sintering the green sheet and the conductive paste at the same time. For example, in a case of a green sheet of ceramics (alumina ceramics) containing aluminum oxide (alumina) as a main component and a conductive paste of tungsten, a sintering agent (for example, silica, magnesia, calcia, yttria, and the like) is generally included in alumina ceramics. Ceramics containing the sintering agent is likely to decrease in value of an insulation resistance as a temperature of a usage environment rises. Therefore, it is needed alumina ceramics that has a small temperature dependence of the insulation resistance and does not contain the sintering agent. However, since there is no sintering agent that becomes a liquid phase during the firing, the bonding strength with tungsten that is a conductor may not be obtained.

SUMMARY OF INVENTION

A ceramic substrate according to the non-limiting embodiment of the present disclosure comprises:
a substrate main body; and
a conductor layer provided inside of the substrate main body,
wherein the substrate main body comprises:
an insulator layer that is ceramics composed of aluminum oxide, and a composite oxide layer of aluminum and silicon, the composite oxide layer being formed between the insulator layer and the conductor layer.

An electrostatic chuck according to the non-limiting embodiment of the present disclosure comprises:
a substrate main body; and
an electrostatic electrode provided inside of the substrate main body,
wherein the substrate main body comprises:
an insulator layer that is ceramics composed of aluminum oxide, and a composite oxide layer of aluminum and silicon, the composite oxide layer being formed between the insulator layer and the electrostatic electrode.

A manufacturing method of an electrostatic chuck comprising a substrate main body and an electrostatic electrode provided inside of the substrate main body, according to the non-limiting embodiment of the present disclosure, the manufacturing method comprises:
forming a conductor pattern, on an upper surface of a green sheet, by a conductive paste, the green sheet being composed of a mixture of aluminum oxide, which does not contain a sintering agent, and an organic material, the conductive paste in which tungsten is a main component and nickel oxide, aluminum oxide and silicon dioxide are added; and
firing the green sheet and the conductor pattern to form the substrate main body and the electrostatic electrode,
wherein the substrate main body comprises:
an insulator layer that is ceramics composed of aluminum oxide, and a composite oxide layer of aluminum and silicon formed between the insulator layer and the electrostatic electrode.

According to one aspect of the present invention, it is possible to provide the conductor layer formed in ceramics composed of high-purity aluminum oxide, the ceramic substrate having the electrostatic electrode, the electrostatic chuck, and the manufacturing method of an electrostatic chuck.

DESCRIPTION OF EMBODIMENTS

Figure 1:
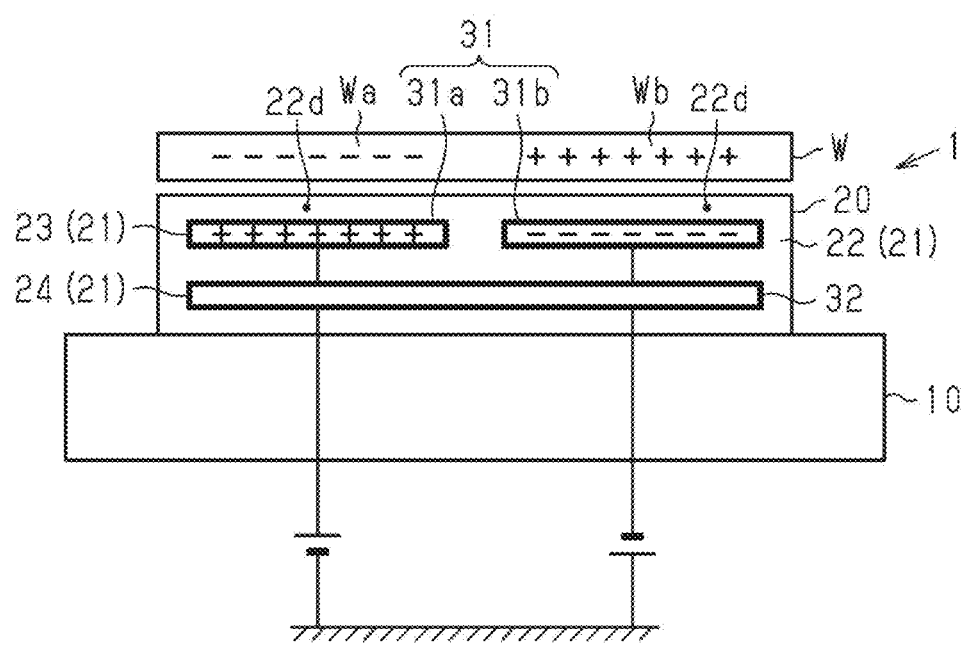
FIG. 1 is a schematic sectional view of an electrostatic chuck of a first embodiment.

Hereinbelow, each embodiment will be described with reference to the accompanying drawings. Note that, for easy understanding of features, elements in the drawings may be partially enlarged for convenience sake and thus have not necessarily been drawn to scale. To facilitate understanding of sectional structures of each member, hatching lines of some members may be omitted or be replaced with shadings in the cross-sectional drawings. Note that, in the present specification, a plan view refers to a view of a target as seen from a vertical direction in FIG. 1 and the like (an upper and lower direction in the drawings), and a planar shape refers to a shape of a target as seen from a vertical direction in FIG. 1 and the like.

First Embodiment

A first embodiment is now described with reference to FIGS. 1 to 20.

FIG. 1 is a schematic sectional view of an electrostatic chuck of the first embodiment.

As shown in FIG. 1, an electrostatic chuck 1 includes a base plate 10, and a mounting stage 20 arranged on the base plate 10. The mounting stage 20 is fixed to an upper surface of the base plate 10 by an adhesive such as silicone resin. Note that the mounting stage 20 may also be fixed to the base plate 10 by screws. A substrate W is placed on an upper surface of the mounting stage 20. The substrate W is, for example, a semiconductor wafer. The electrostatic chuck 1 is configured to suck and hold the substrate W placed on the mounting stage 20.

Figure 2:
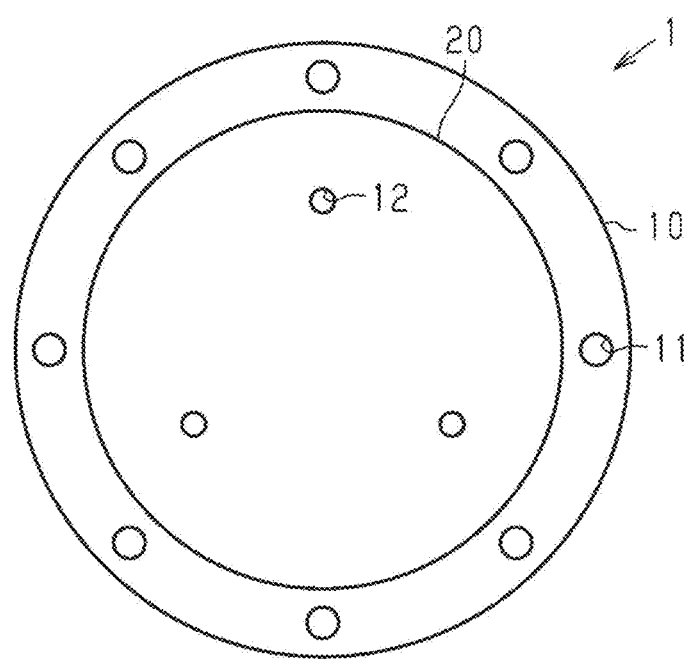
FIG. 2 is a schematic plan view of the electrostatic chuck.

As shown in FIG. 2, the base plate 10 and the mounting stage 20 each have a circular shape, as seen from above. That is, the base plate 10 and the mounting stage 20 each have a disc shape. As shown in FIG. 2, the base plate 10 is exposed around the mounting stage 20. A peripheral edge portion of the base plate 10 is formed with attachment holes 11 for attaching the base plate to a chamber of a semiconductor manufacturing apparatus. The mounting stage 20 and the base plate 10 each have a plurality of (three, in this example) openings 12 for a lift pin at a central part. Lift pins for vertically moving the substrate W shown in FIG. 1 are inserted into the openings 12 for a lift pin. By moving up the substrate beyond the mounting stage with the lift pins, it is possible to automatically convey the substrate W by a conveyor apparatus.

The base plate 10 is formed of a metal material such as aluminum or cemented carbide, a composite material of the metal material and a ceramic material, or the like, for example. For example, from standpoints of easy availability, easy processing, favorable thermal conductivity and the like, aluminum or an alloy thereof is used and a surface thereof is alumite treated (insulation layer is formed). The base plate 10 may also be provided with a supply path of a coolant (gas, cooling water and the like) for cooling the substrate W placed on the upper surface of the mounting stage 20, for example.

As shown in FIG. 1, the mounting stage 20 includes a substrate main body 21, and an electrostatic electrode 31 and a heating element 32 provided in the substrate main body 21.

The electrostatic electrode 31 is a conductor layer formed in a film shape. The electrostatic electrode 31 of the present embodiment is a bipolar type and has a first electrostatic electrode 31a and a second electrostatic electrode 31b. Note that, as the electrostatic electrode 31, a unipolar type consisting of one electrostatic electrode may also be used. The electrostatic electrode 31 is a fired body having tungsten (W) as a main component and containing nickel oxide (NiO), aluminum oxide and silicon dioxide ($SiO_2$). As a material of the electrostatic electrode 31, a conductive paste in which tungsten (W) is a main component and nickel oxide (NiO), aluminum oxide and silicon dioxide ($SiO_2$) are added is used.

The heating element 32 is arranged below the first electrostatic electrode 31a and the second electrostatic electrode 31b. The heating element 32 is a conductor layer formed in a film shape. The heating element 32 is provided as a plurality of heater electrodes capable of independently heating and controlling a plurality of areas (heater zones) of the substrate main body 21 in a plane. Note that, the heating element 32 may also be provided as one heater electrode. The heating element 32 is a fired body having tungsten (W) as a main component and containing nickel oxide (NiO), aluminum oxide and silicon dioxide ($SiO_2$). As a material of the heating element 32, a conductive paste in which tungsten (W) is a main component and nickel oxide (NiO), aluminum oxide and silicon dioxide ($SiO_2$) are added is used.

As shown in FIGS. 1 and 2, the substrate main body 21 has a disc shape corresponding to the shape of the substrate W.

Figure 3:
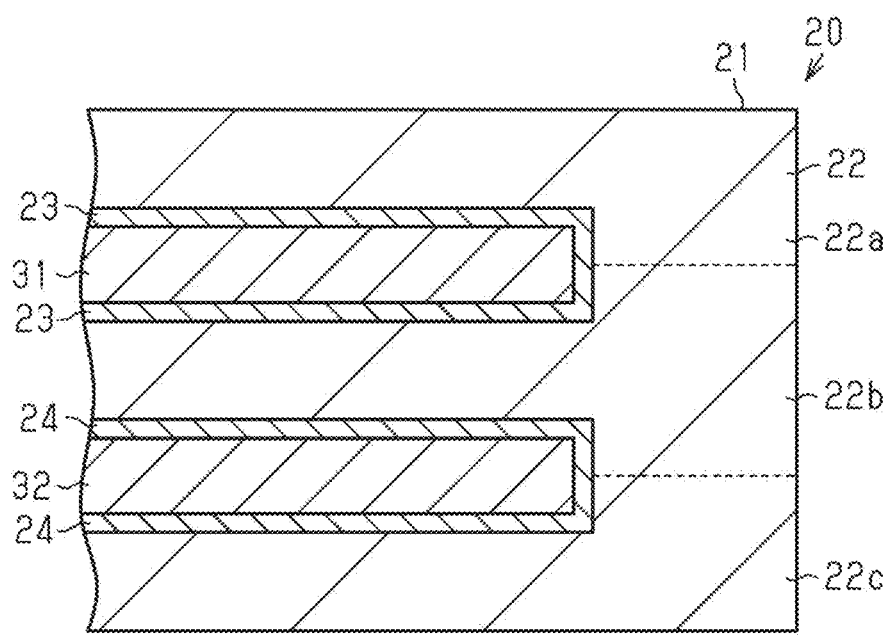
FIG. 3 is a partial sectional view of the electrostatic chuck.

As shown in FIGS. 1 and 3, the substrate main body 21 includes an insulator layer 22, a composite oxide layer 23 between the insulator layer 22 and the electrostatic electrode 31, and a composite oxide layer 24 between the insulator layer 22 and the heating element 32.

The insulator layer 22 is ceramics composed of aluminum oxide ($Al_2O_3$). "Ceramics composed of aluminum oxide" means ceramics in which inorganic components except aluminum oxide are not added. In the insulator layer 22 composed of ceramics, a purity of aluminum oxide is preferably equal to or higher than 99.5%. The purity of 99.5% or higher indicates that aluminum oxide is formed without adding a sintering agent. The purity of 99.5% or higher also means that unintended impurities may also be included in a manufacturing process and the like. The insulator layer 22 preferably has a relative density of 98% or higher. The insulator layer 22 preferably has an average particle size of aluminum oxide of 1.0 μm or larger and 3.0 μm or smaller.

As shown in FIG. 1, the composite oxide layer 23 is formed to cover the entire electrostatic electrode 31. The composite oxide layer 24 is formed to cover the entire heating element 32. The composite oxide layers 23 and 24 are each a composite oxide layer of aluminum (Al) and silicon (Si). The composite oxide layers 23 and 24 are each a layer composed of mullite ($3Al_2O_3 \cdot 2SiO_2$ ($Al_6Si_2O_{13}$)), a layer composed of sillimanite ($Al_2O_3 \cdot SiO_2$ ($Al_2SiO_5$)), or a layer in which mullite and sillimanite are mixed.

Figure 4:
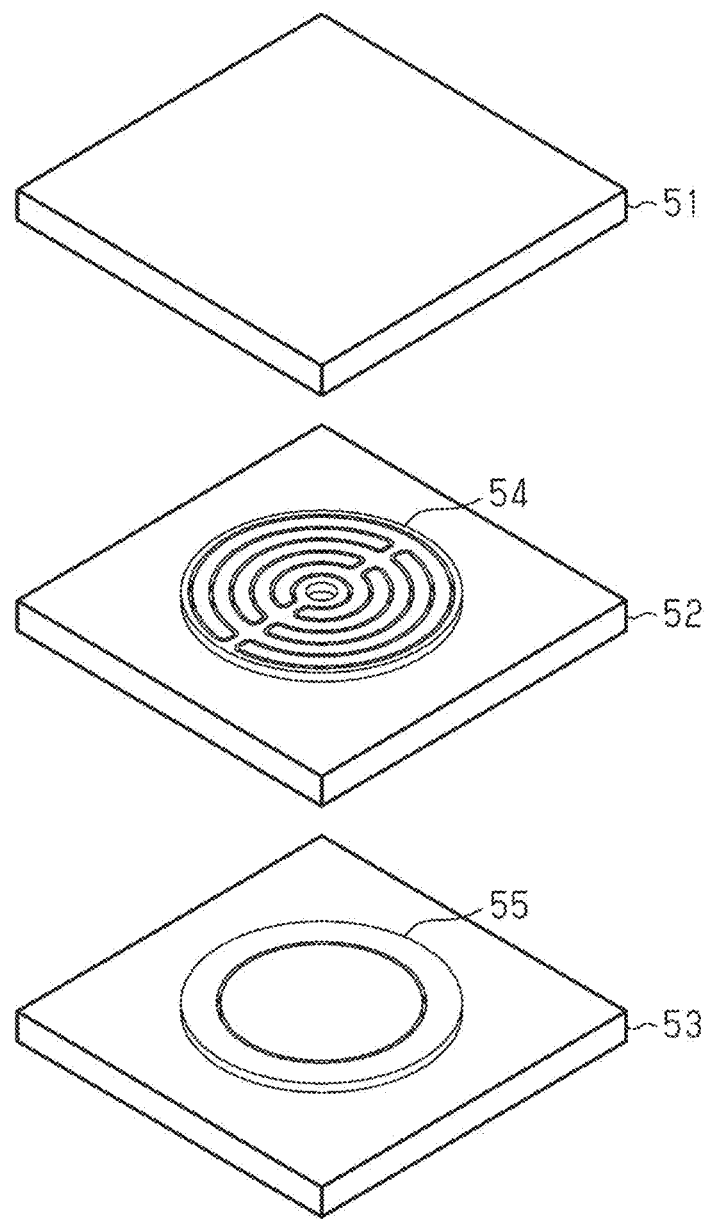
FIG. 4 is a perspective view depicting a manufacturing process of the electrostatic chuck.
Figure 5:
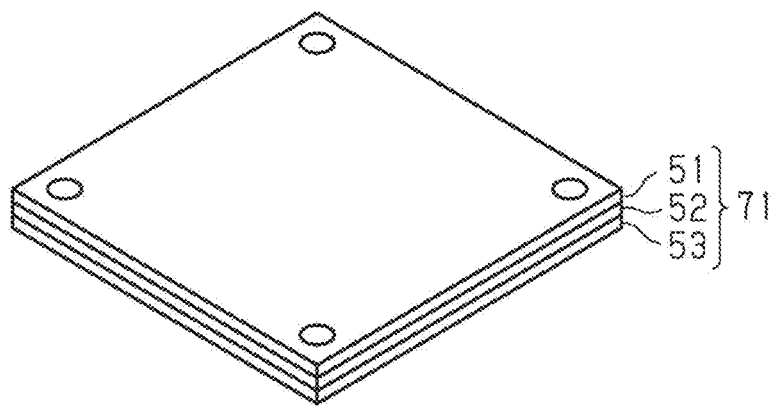
FIG. 5 is a perspective view depicting the manufacturing process of the electrostatic chuck.

As shown in FIG. 3, the insulator layer 22 is configured by, for example, three insulation layers 22a, 22b and 22c. Each of the insulation layers 22a, 22b and 22c is a sintered body formed by sintering a green sheet composed of a mixture of aluminum oxide having no sintering agent and an organic material, together with the composite oxide layers 23 and 24. Note that, the dotted lines shown in FIG. 3 indicate interfaces between the insulation layer 22a and the insulation layer 22b and between the insulation layer 22b and the insulation layer 22c. These interfaces are formed as green sheets 51 to 53 shown in FIGS. 4 and 5 are stacked, and positions thereof may be different and the interfaces in the cross-section may not be straight or clear, depending on a stacked state.

A method of manufacturing the mounting stage 20 is described. A conductor pattern for the electrostatic electrode 31 and a conductor pattern for the heating element 32 are each sandwiched by the green sheets 51 to 53 shown in FIGS. 4 and 5, and the stacked body is then sintered. Thereby, the mounting stage 20 in which the electrostatic electrode 31 and the heating element 32 are provided inside of the substrate main body 21 and the composite oxide layers 23 and 24 are provided between the substrate main body 21 and the electrostatic electrode 31 and heating element 32 can be obtained.

As shown in FIG. 1, in the electrostatic chuck 1 of the present embodiment, the substrate W is placed on the mounting stage 20. Then, a plus (+) voltage is applied to the first electrostatic electrode 31a and a minus (−) voltage is applied to the second electrostatic electrode 31b. Thereby, plus (+) electrical charges are charged in the first electrostatic electrode 31a, and minus (−) electrical charges are charged in the second electrostatic electrode 31b. As a result, the minus (−) electrical charges are induced to a part Wa of the substrate W corresponding to the first electrostatic electrode 31a, and the plus (+) electrical charges are induced to a part Wb of the substrate W corresponding to the second electrostatic electrode 31b.

When the substrate W, the electrostatic electrode 31 and a ceramic part 22d of the insulator layer 22 positioned above the electrostatic electrode 31 are regarded as a capacitor, the ceramic part 22d corresponds to a dielectric layer. The substrate W is electrostatically sucked on the mounting stage 20 by a Coulomb force generated between the electrostatic electrode 31 and the substrate W via the ceramic part 22d. Then, a predetermined voltage is applied to the heating element 32, so that the mounting stage 20 is heated. The substrate W is controlled to a predetermined temperature by a temperature of the mounting stage 20. The heating temperature of the electrostatic chuck 1 is set to 50° C. to 200° C., for example, 150° C.

[Manufacturing Method]

Subsequently, a manufacturing method of the mounting stage 20 is described.

First, as shown in FIG. 4, the green sheets 51 to 53 composed of a ceramic material and an organic material are prepared. Each of the green sheets 51 to 53 has a rectangular plate shape. The ceramic material of each of the green sheets 51 to 53 is composed of aluminum oxide and does not contain a sintering agent.

The green sheet 51 is made to be the insulator layer 22 (insulation layer 22a) of a part, on which the substrate W shown in FIG. 1 is mounted, by removing organic components, and sintering and densifying the ceramic material. The green sheet 52 is fired to be the insulator layer 22 (insulation layer 22b) of a part between the electrostatic electrode 31 and the heating element 32. The green sheet 53 is fired to be the insulator layer 22 (insulation layer 22c) of a part bonded to the base plate 10 shown in FIG. 1.

Then, a conductive paste is applied to form a conductor pattern 54 on an upper surface of the green sheet 52 by a printing method (screen printing), for example. The conductor pattern 54 is fired in a process to be described later and thus becomes the electrostatic electrode 31 shown in FIG. 1. Note that, the conductor pattern 54 may also be formed on a lower surface of the green sheet 51.

The conductive paste that is used for formation of the conductor pattern 54 has tungsten as a main component, and contains nickel oxide, aluminum oxide, silicon dioxide and organic material, which are mixed. An additive amount of nickel oxide is preferably 0.2 wt % or more and 1.0 wt % or less with respect to tungsten. Nickel oxide is preferably added by 0.2 wt % or more so as to improve sinterability of tungsten. On the other hand, when nickel oxide is added by 1 wt % or more, crystals of tungsten become too large, so that sufficient adhesion with the substrate main body 21 cannot be obtained. When co-firing the conductive paste and the green sheet, an average particle size of tungsten is preferably 0.5 μm or larger and 3.0 μm or smaller. Similarly, an average particle size of nickel oxide is 5.0 μm or larger and 15.0 μm or smaller.

An additive amount of aluminum oxide is preferably 0.2 wt % or more and 3.0 wt % or less with respect to tungsten. Aluminum oxide is preferably added by 0.2 wt % or more so as to improve adhesion between the electrostatic electrode 31 and the substrate main body 21 of ceramics composed of aluminum oxide. On the other hand, when aluminum oxide is added more than 3.0 wt %, the sinterability is lowered and a resistivity increases. When co-firing the conductive paste and the green sheet, an average particle size of aluminum oxide is preferably 1.0 μm or larger and 4.0 μm or smaller.

An additive amount of silicon dioxide is preferably 0.2 wt % or more and 3.0 wt % or less with respect to tungsten. Silicon dioxide becomes a liquid phase during firing, and is preferably added by 0.2 wt % or more so as to improve the sinterability of tungsten and adhesion with the substrate main body 21. On the other hand, when silicon dioxide is added more than 3.0 wt %, the sinterability and the adhesion are lowered and the resistivity increases. When co-firing the conductive paste and the green sheet, an average particle size of silicon dioxide is preferably 0.1 μm or larger and 12.0 μm or smaller.

Then, a conductive paste is applied to form a conductor pattern 55 on an upper surface of the green sheet 53 by a printing method (screen printing), for example. As the conductive paste for forming the conductor pattern 55, the conductive paste of the same material as the conductive paste for forming the conductor pattern 54 may be used. The conductor pattern 55 is fired in a process to be described later and thus becomes the heating element 32. Note that, the conductor pattern 55 may also be formed on a lower surface of the green sheet 52.

Then, as shown in FIG. 5, the green sheets 51 to 53 are each stacked to form a structure 71. The green sheets 51 to 53 are each heated and pressurized and are thus bonded to each other.

Figure 6:
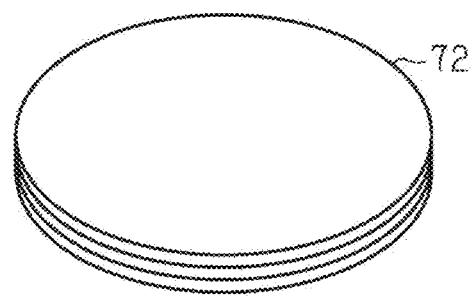
FIG. 6 is a perspective view depicting the manufacturing process of the electrostatic chuck.

Then, as shown in FIG. 6, a disc-shaped structure 72 is formed by cutting a periphery of the structure 71.

Figure 7:
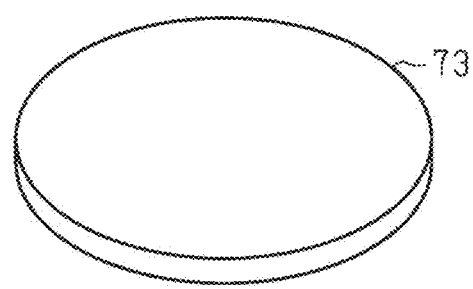
FIG. 7 is a perspective view depicting the manufacturing process of the electrostatic chuck.

Then, the structure 72 is fired at an atmospheric pressure, so that a ceramic substrate 73 shown in FIG. 7 is obtained. A temperature of the firing is, for example, 1600° C. In the ceramic substrate 73, the insulator layer 22 shown in FIG. 1, the electrostatic electrode 31 and the heating element 32 (refer to FIG. 1) obtained by sintering the conductor patterns 54 and 55 shown in FIG. 4, and the composite oxide layers 23 and 24 are embedded. The ceramic substrate 73 is subjected to a variety of processing.

For example, both an upper surface and a lower surface of the ceramic substrate 73 are polished to be a mounting surface and a bonding surface. Also, the ceramic substrate 73 is formed with the openings 12 for a lift pin shown in FIG. 1. By the above processes, the mounting stage 20 is obtained.

(Operations)
[Shape of Sample]

Figure 8A:
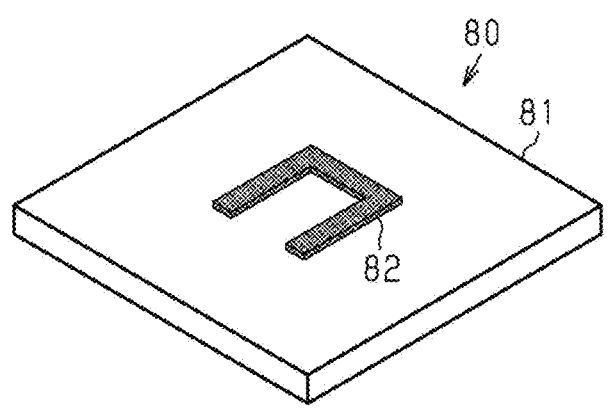
FIG. 8A is a perspective view depicting a scratch test.
Figure 8B:
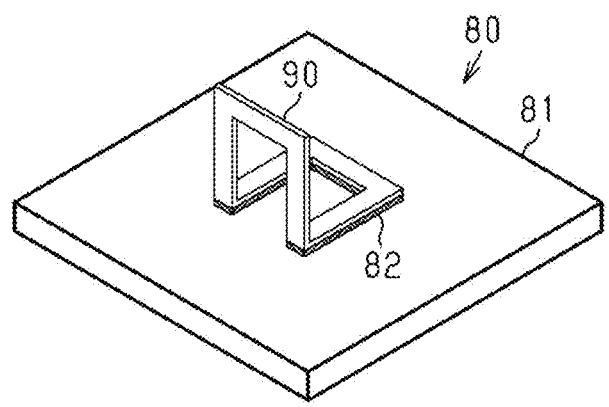
FIG. 8B is a perspective view depicting a peeling test.

FIG. 8A depicts a shape of a sample. The sample 80 has a ceramic substrate 81, and a conductor pattern 82 on an upper surface of the ceramic substrate 81. The sample 80 is formed by printing a conductive paste on a green sheet and integrally co-firing the same. During a peeling test, as shown in FIG. 8B, a ring 90 made of kovar is heated and bonded to an upper surface of the conductor pattern 82 of the sample 80, via a silver solder containing copper. By a tensile test apparatus, one end of the ring 90 is pulled upward with the ceramic substrate 81 being fixed, thereby peeling off the conductor pattern 82 from the ceramic substrate 81. At this time, a testing force is recorded.

[Preparation of Sample]
(Sample 1)

A conductive paste in which nickel oxide powders of 0.5 wt %, alumina powders of 2.0 wt % and silica powders of 2.0 wt % with respect to an amount of tungsten powders are added was printed on a green sheet of aluminum oxide not containing a sintering agent, which were then integrally co-fired at the atmospheric pressure. As a result, Sample 1 was obtained.

Sample 1 was Analyzed by an EPMA (Electron Probe Microanalyzer).

Figure 9:
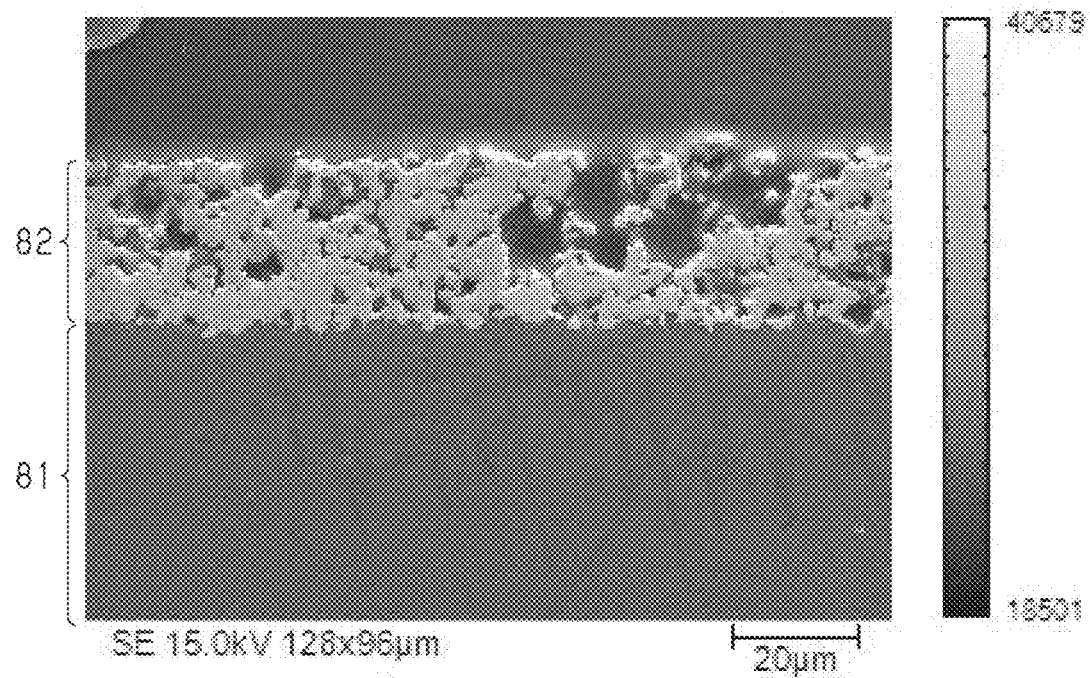
FIG. 9 is a sectional view showing an SE phase (secondary electron image) of Sample 1.

FIG. 9 shows an SE phase (secondary electron image) of Sample 1.

Figure 10:
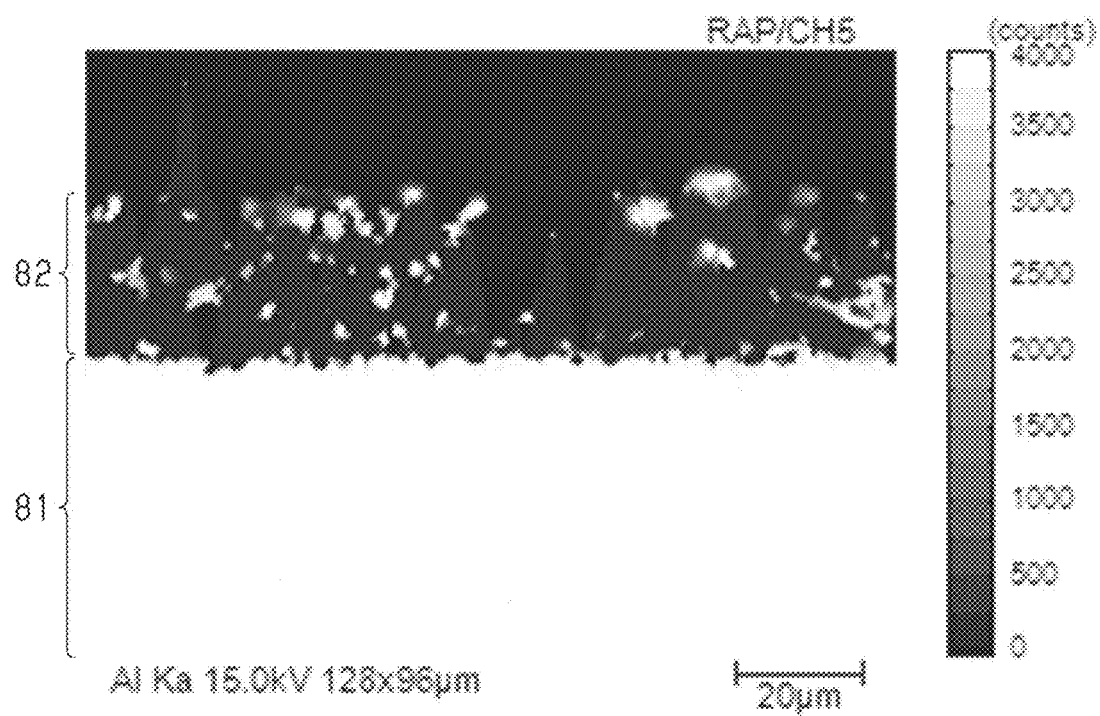
FIG. 10 is a sectional view showing an aluminum analysis result of Sample 1.

FIG. 10 shows an aluminum analysis result of Sample 1. Aluminum is contained in both the conductor pattern 82 and the ceramic substrate 81. For this reason, it is considered that the adhesion strength between the conductor pattern 82 and the ceramic substrate 81 is improved.

Figure 11:
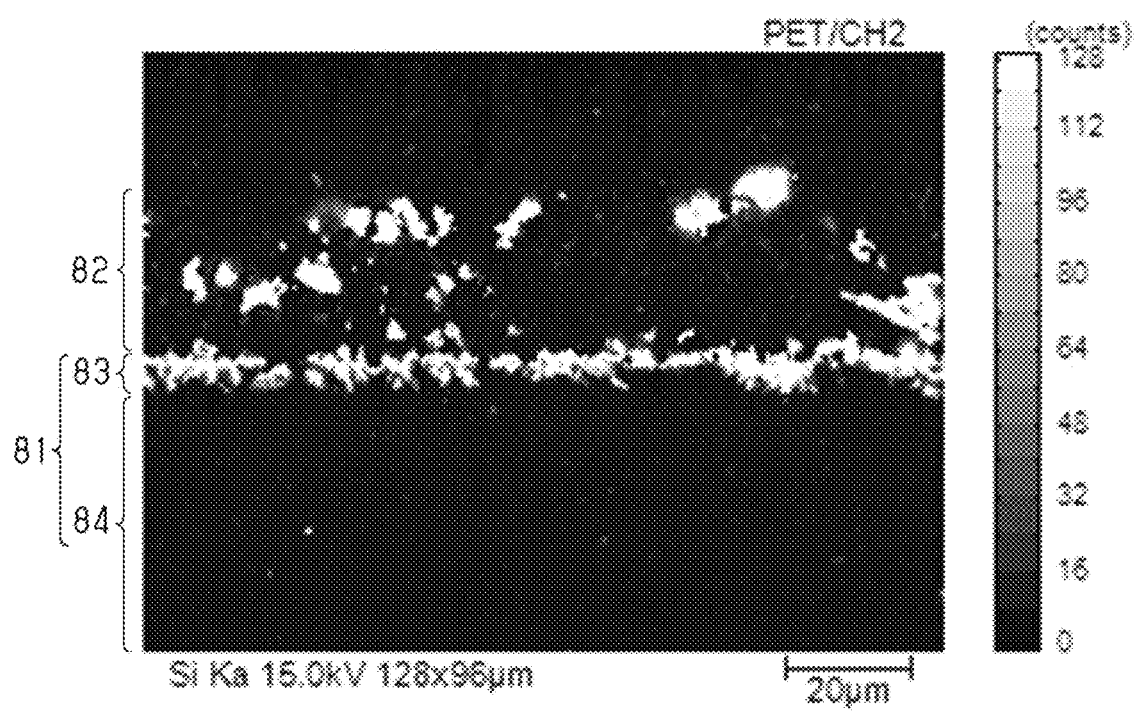
FIG. 11 is a sectional view showing a silicon analysis result of Sample 1.

FIG. 11 shows a silicon analysis result of Sample 1. Silicon is contained in both the conductor pattern 82 and the ceramic substrate 81. Particularly, in the ceramic substrate 81, it was confirmed that silicon exists only within a range of 20 μm from the interface between the conductor pattern 82 and the ceramic substrate 81 and does not exist in a part beyond the range. As shown in FIGS. 10 and 11, in the ceramic substrate 81, an area in which aluminum and silicon exist is the composite oxide layer 83, and an area in which silicon does not exist is the insulator layer 84. In this way, the composite oxide layer 83 of aluminum and silicon is formed in the vicinity of the boundary between the conductor pattern 82 and the ceramic substrate 81, so that silicon does not diffuse over the entire ceramic substrate 81. Thereby, it is considered that the adhesion strength between the conductor pattern 82 and the ceramic substrate 81 is improved without deteriorating an electric characteristic of the ceramic substrate 81.

Figure 12:
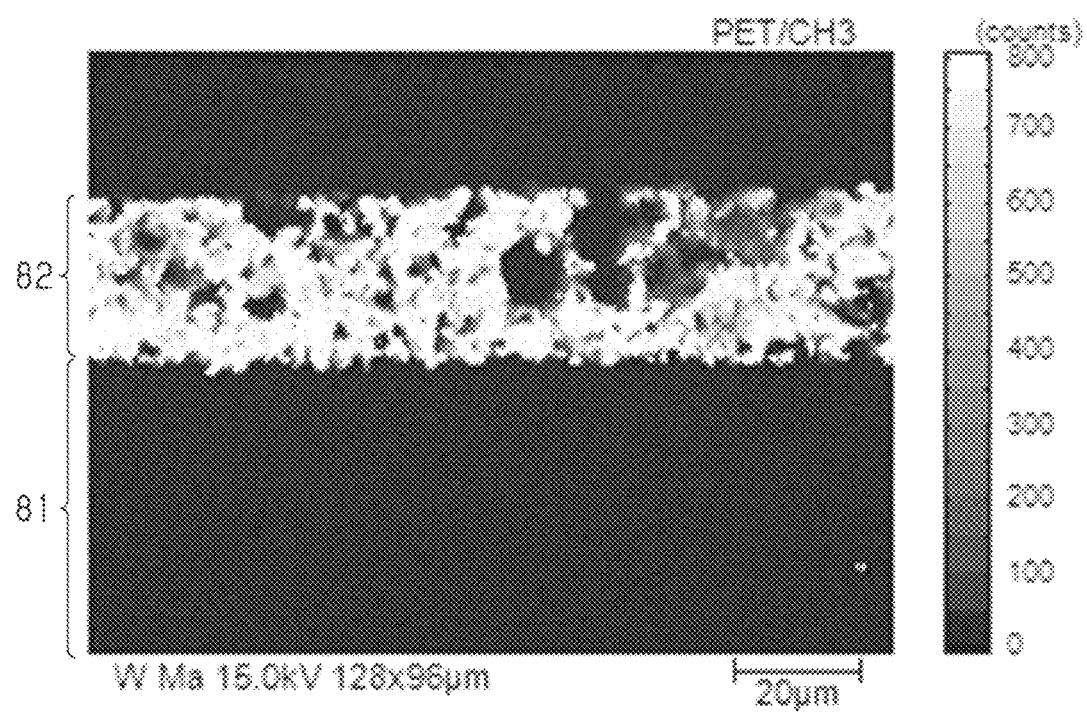
FIG. 12 is a sectional view showing a tungsten analysis result of Sample 1.

FIG. 12 shows a tungsten analysis result of Sample 1. Tungsten exists locally in the conductor pattern 82, and is not diffused into the ceramic substrate 81. In order to obtain the favorable sinterability of the conductor pattern 82 and the favorable electric characteristic of the ceramic substrate 81, tungsten preferably exists only in the conductor pattern 82.

Figure 13:
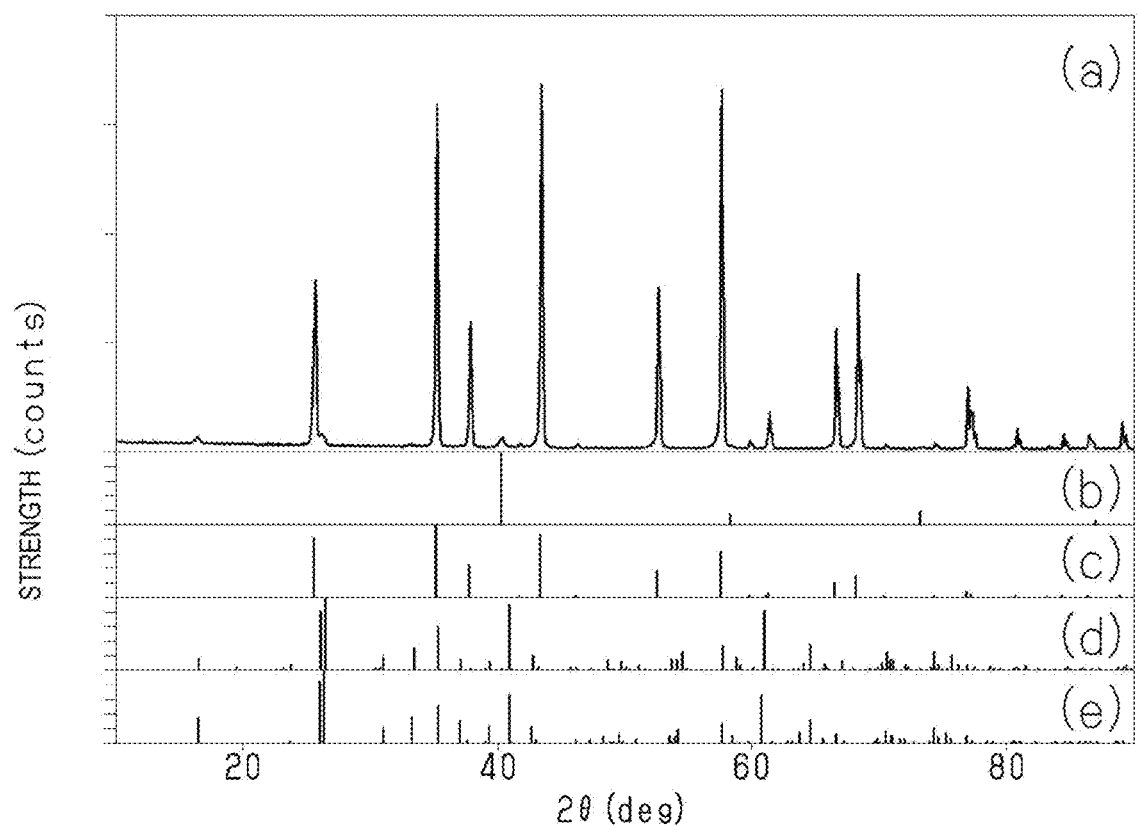
FIG. 13 is a chart diagram depicting an XRD analysis result of Sample 1.

FIG. 13 depicts an XRD (X-ray diffraction) analysis chart of Sample 1. In FIG. 13, (a) shows an XRD chart of a part of the ceramic substrate 81 exposed by cutting the conductor pattern 82 of Sample 1. In FIG. 13, (b), (c), (d) and (e) show XRD charts of tungsten, aluminum oxide, sillimanite and mullite, respectively. From the results shown in FIG. 13, it was confirmed that crystalline phases of mullite, sillimanite or mixed mullite and sillimanite are formed in the ceramic substrate 81 of Sample 1. Note that, although not shown, it was confirmed that peaks of XRD charts of composite oxides except mullite and sillimanite among the composite oxides of aluminum and silicon do not match peaks of the XRD chart of Sample 1 shown in (a) of FIG. 13.

The silicon component of silicon oxide added to the conductive paste is divided into a silicon component remaining in the conductor pattern 82 and a silicon component diffusing into the ceramic substrate 81 after the firing. The silicon component diffused from the conductor pattern 82 into the ceramic substrate 81 forms a composite oxide layer of aluminum and silicon in the vicinity of the boundary between the conductor pattern 82 and the ceramic substrate 81 and does not diffuse into the ceramic layer. The composite oxide layer of aluminum and silicon is a layer composed of mullite, a layer composed of sillimanite or a layer in which mullite and sillimanite are mixed. The silicon component is diffused into the ceramic substrate 81, according to the additive amounts of aluminum oxide and silicon dioxide added to the conductive paste. Therefore, it is possible to control a thickness of the composite oxide layer by a diffusion range of the silicon component, i.e., the additive amounts of aluminum oxide and silicon dioxide.

(Sample 2)

A conductive paste in which nickel oxide powders of 0.5 wt %, alumina powders of 2.0 wt % and silica powders of 2.0 wt % with respect to an amount of tungsten powders are added was printed on a green sheet of aluminum oxide not containing a sintering agent, which were then integrally co-fired at the atmospheric pressure. As a result, Sample 2 was obtained.

Sample 2 was Analyzed by the EPMA (Electron Probe Microanalyzer).

Figure 14:
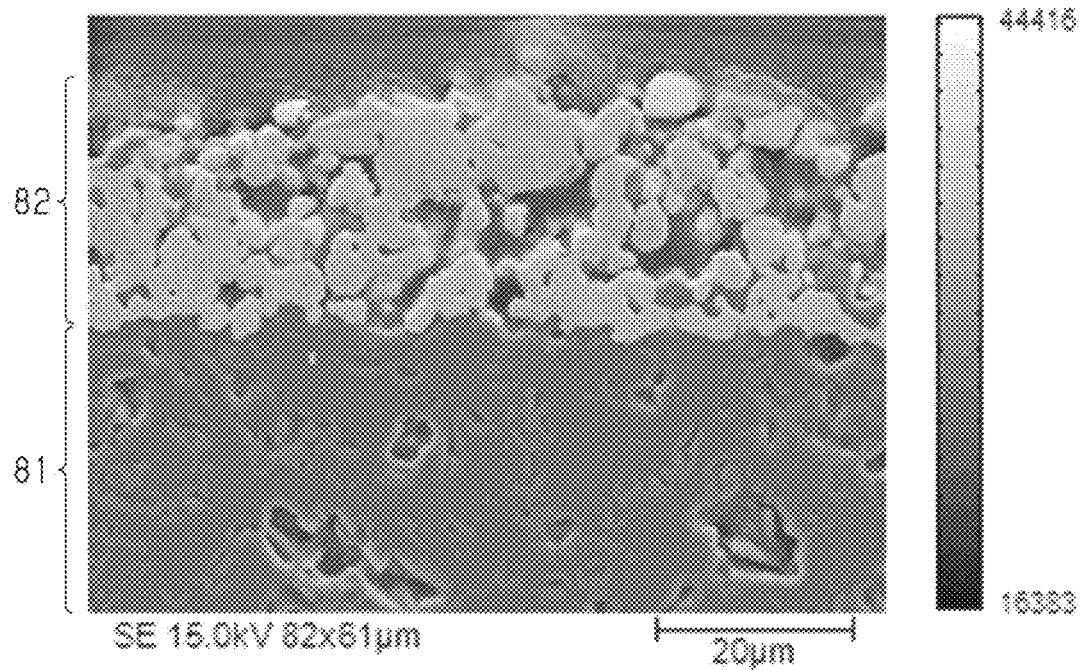
FIG. 14 is a sectional view showing an SE phase (secondary electron image) of Sample 2.

FIG. 14 shows an SE phase (secondary electron image) of Sample 2.

Figure 15:
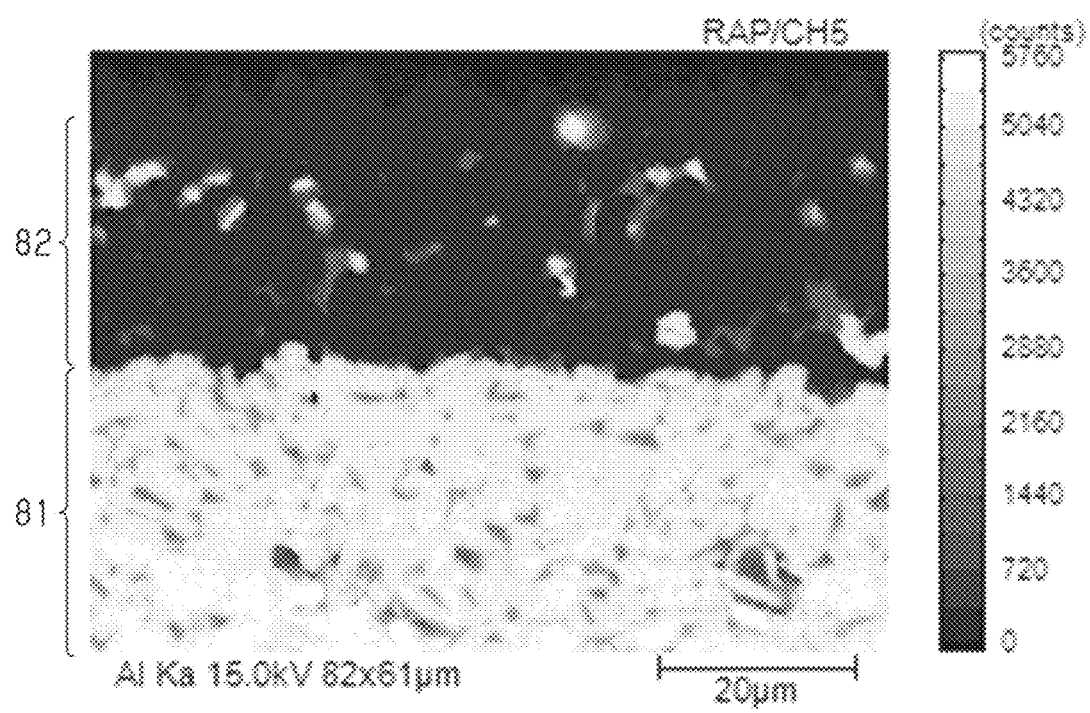
FIG. 15 is a sectional view showing an aluminum analysis result of Sample 2.

FIG. 15 shows an aluminum analysis result of Sample 2. Aluminum is contained in both the conductor pattern 82 and the ceramic substrate 81.

Figure 16:
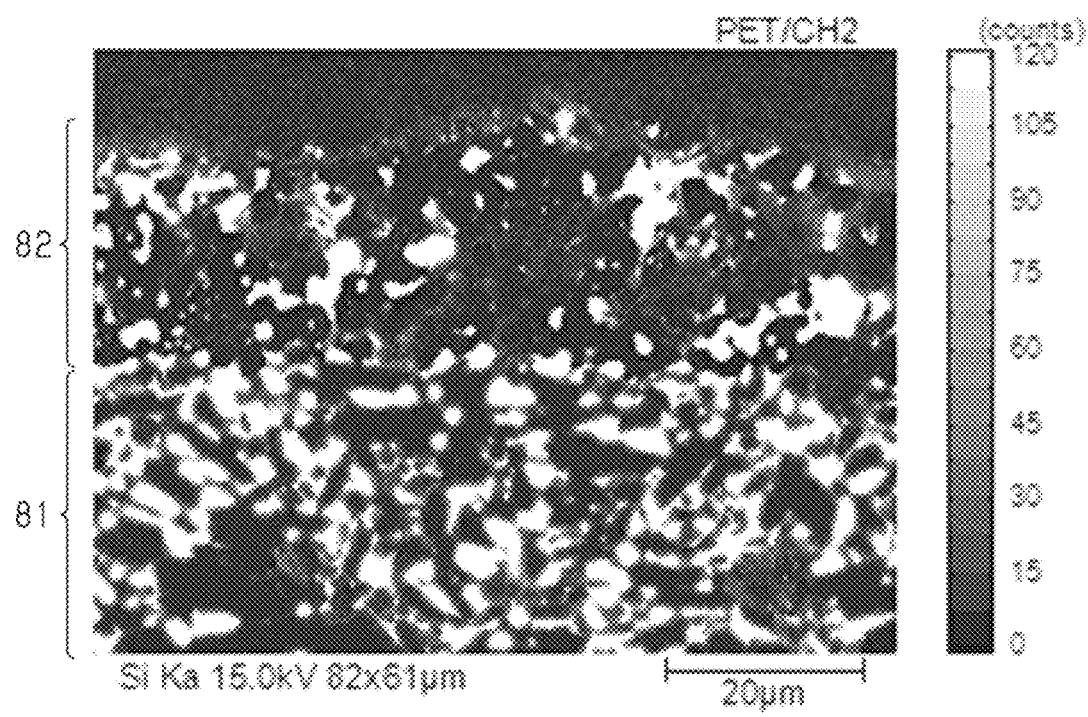
FIG. 16 is a sectional view showing a silicon analysis result of Sample 2.

FIG. 16 shows a silicon analysis result of Sample 2. Silicon is contained in both the conductor pattern 82 and the ceramic substrate 81. In Sample 2, it was confirmed that the silicon component is widely spread in the ceramic substrate 81.

Figure 17:
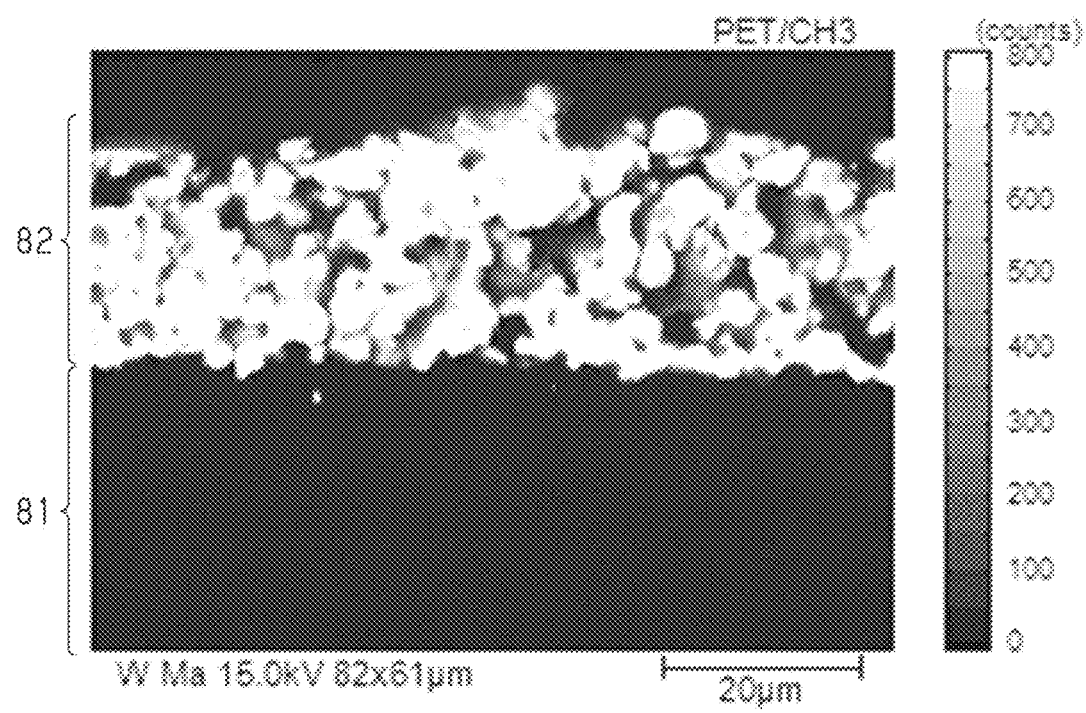
FIG. 17 is a sectional view showing a tungsten analysis result of Sample 2.

FIG. 17 shows a tungsten analysis result of Sample 2. Tungsten exists locally in the conductor pattern 82, and is not diffused into the ceramic substrate 81.

Figure 18:
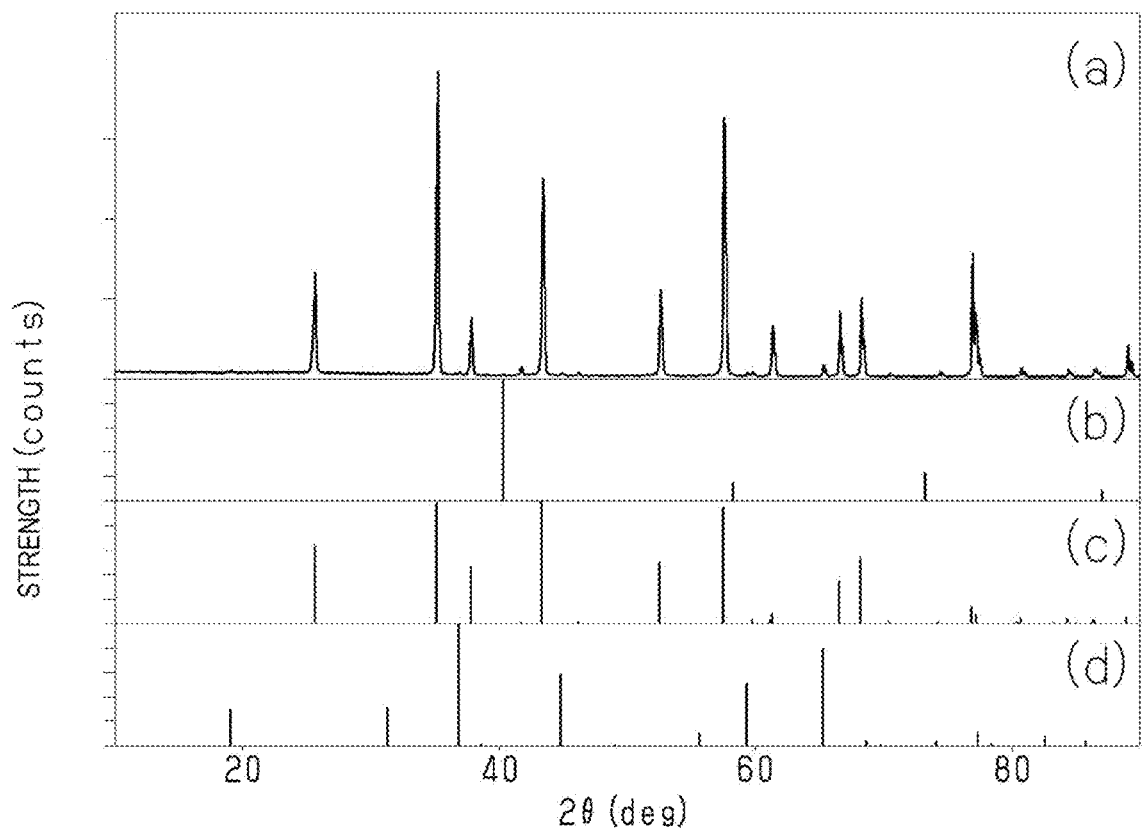
FIG. 18 is a chart diagram depicting an XRD analysis result of Sample 2.

FIG. 18 depicts an XRD (X-ray diffraction) analysis chart of Sample 2. In FIG. 18, (a) shows an XRD chart of a part of the ceramic substrate 81 exposed by cutting the conductor pattern 82 of Sample 2. In FIG. 13, (b), (c) and (d) show XRD charts of tungsten, aluminum oxide, and composite oxide ($Mg \cdot Al_2O_4$) of magnesium and aluminum, respectively. From the results shown in FIG. 18, it was confirmed that crystalline phases of mullite and sillimanite are not formed in the ceramic substrate 81 of Sample 2.

[Test Result]

Figure 19:
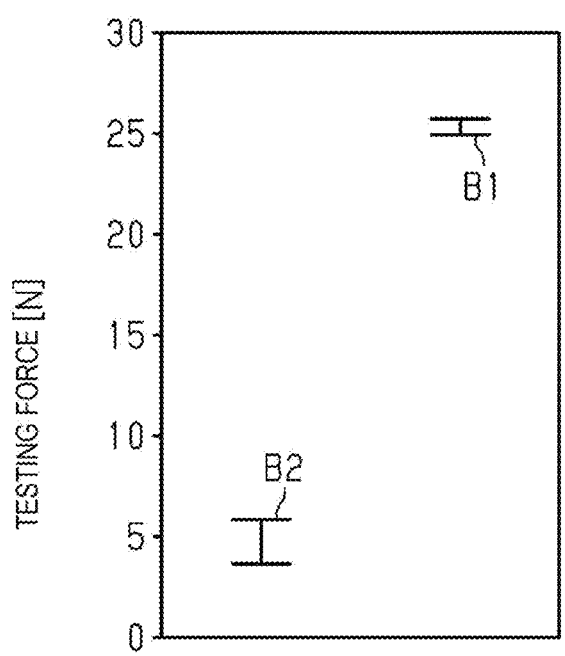
FIG. 19 illustrates test results of Samples 1 and 2.

FIG. 19 depicts a measurement result of the adhesion strength by a tensile test. In FIG. 19, a bar B1 indicates a range of the testing force [N] when checking the adhesion strength of the conductor pattern, which is formed using Sample 1, i.e., the conductive paste in which nickel oxide powders of 0.5 wt %, alumina powders (aluminum oxide powders) of 2.0 wt % and silica powders (silicon oxide powders) of 2.0 wt % are added, by a peeling test. A bar B2 indicates a range of the testing force [N] in Comparative Example including the conductor pattern 82 formed using an additive-free electroconductive material composed of tungsten and not containing nickel oxide, aluminum oxide and silicon dioxide. By adding aluminum oxide and silicon dioxide, it is possible to improve the adhesion strength of the conductor pattern. By increasing contents of aluminum oxide and silicon dioxide, it is possible to further improve the adhesion strength of the conductor pattern.

[Characteristics of Temperature and Resistance Value]

Figure 20:
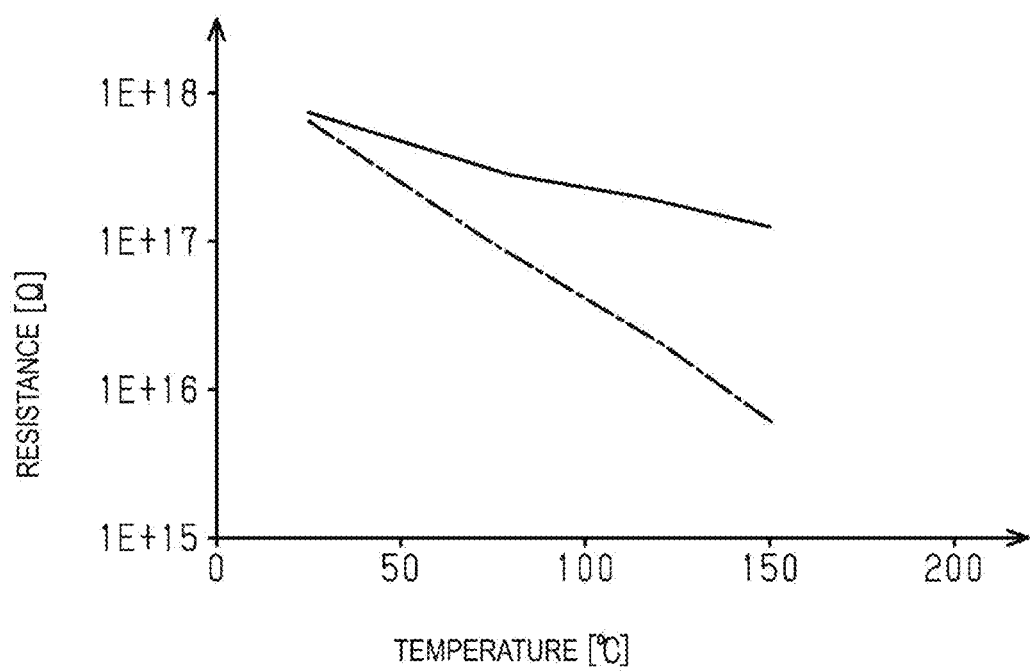
FIG. 20 illustrates a relation between a temperature and a resistance value of ceramics.

In FIG. 20, a solid line indicates a relation between a temperature and a resistance value of ceramics (hereinbelow, referred to as additive-free ceramics) obtained by firing a green sheet of aluminum oxide that does not contain a sintering agent, and a dashed-dotted line indicates a relation of a temperature and a resistance value of ceramics (hereinbelow, referred to as added ceramics) obtained by firing a green sheet having a composition containing a sintering agent. In the additive-free ceramics, a change in resistance value with respect to the temperature is small. In the added ceramics, the change in resistance with respect to the temperature is larger, as compared to the additive-free ceramics. That is, the additive-free ceramics has a low temperature dependence of the insulation resistance. As a characteristic required for ceramics for an electrostatic chuck, it is required that the insulation resistance less decreases even though the temperature of the usage environment rises. The additive-free ceramics have such characteristic is effective as the substrate main body 21 including the electrostatic electrode 31.

As described above, according to the present embodiment, following effects are realized.

(1-1) The mounting stage 20 of the electrostatic chuck 1 includes the substrate main body 21, and the electrostatic electrode 31 provided inside of the substrate main body 21. The substrate main body 21 has the insulator layer 22 of ceramics composed of aluminum oxide and the composite oxide layer 23 of aluminum and silicon formed between the insulator layer 22 and the electrostatic electrode 31. Since the silicon component does not diffuse into the insulator layer 22 of ceramics by the composite oxide layer 23, it is possible to obtain the mounting stage 20 including the electrostatic electrode 31 without lowering the characteristics of ceramics of the substrate main body 21.

(1-2) The mounting stage includes the heating element 32 provided inside of the substrate main body 21. The substrate main body 21 has the composite oxide layer 24 of aluminum and silicon formed between the insulator layer 22 and the heating element 32. Since the silicon component does not diffuse into the insulator layer 22 of ceramics by the composite oxide layer 24, it is possible to obtain the mounting stage 20 including the heating element 32 without lowering the characteristics of ceramics of the substrate main body 21.

(1-3) The electrostatic electrode 31 is a fired body having tungsten (W) as a main component and containing nickel oxide (NiO), aluminum oxide ($Al_2O_3$) and silicon dioxide ($SiO_2$). The electrostatic electrode 31 is configured in this way, so that it is possible to obtain the mounting stage 20 including the electrostatic electrode 31 without lowering the characteristics of ceramics of the substrate main body 21.

(1-4) The heating element 32 is a fired body having tungsten (W) as a main component and containing nickel oxide (NiO), aluminum oxide ($Al_2O_3$) and silicon dioxide ($SiO_2$). The heating element 32 is configured in this way, so that it is possible to obtain the mounting stage 20 including the heating element 32 without lowering the characteristics of ceramics of the substrate main body 21.

(1-5) The sinterability of tungsten is improved by nickel oxide. The adhesion between ceramics and tungsten is improved by aluminum oxide and silicon dioxide. Therefore, since it is not necessary to use a sintering agent, it is possible to obtain the mounting stage 20 including the electrostatic electrode 31 without lowering the characteristics of ceramics.

(1-6) Ceramics of the substrate main body 21 has a purity of aluminum oxide of 99.5% or higher. Such substrate main body 21 has a small temperature dependence of insulation resistance and can suppress the lowering in insulation resistance with respect to the rise in temperature.

(1-7) Ceramics of the substrate main body 21 has a relative density of 98% or higher. Such substrate main body 21 has few pores in a surface and an inside. The pores affect adsorption of the substrate main body 21. Therefore, the substrate main body 21 having a high relative density is preferable as the electrostatic chuck 1 in terms of characteristics.

Second Embodiment

Figure 21:
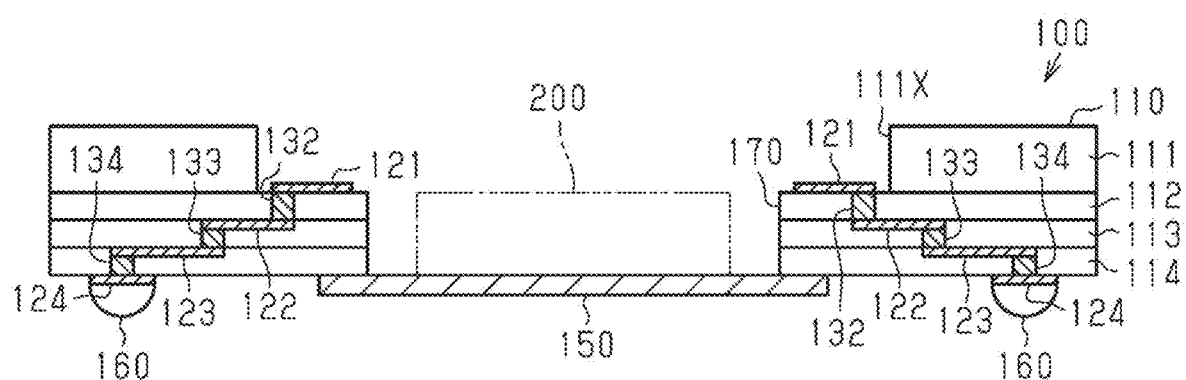
FIG. 21 is a schematic sectional view of a package for a semiconductor of a second embodiment.

In the below, a second embodiment is described with reference to FIGS. 21 and 22. FIG. 21 is a schematic sectional view of a package for a semiconductor of the second embodiment, and FIG. 22 is a schematic plan view of the package for a semiconductor.

As shown in FIG. 21, a package 100 for a semiconductor device includes a ceramic substrate 110, a heat dissipation plate 150, and external connection terminals 160, and the heat dissipation plate 150 is soldered to the ceramic substrate 110.

The ceramic substrate 110 includes a plurality of (four, in the present embodiment) stacked ceramic base materials 111, 112, 113 and 114, wiring patterns 121, 122, 123 and 124 composed of tungsten, and vias 132, 133, 134 penetrating the ceramic base materials 112, 113 and 114. The via 132 interconnects the wiring patterns 121 and 122, the via 133 interconnects the wiring patterns 122 and 123, and the via 134 interconnects the wiring patterns 123 and 124. The ceramic substrate 110 has a substrate main body configured by the ceramic base materials 111 to 114 and the wiring patterns 121 to 124 composed of tungsten.

Figure 22:
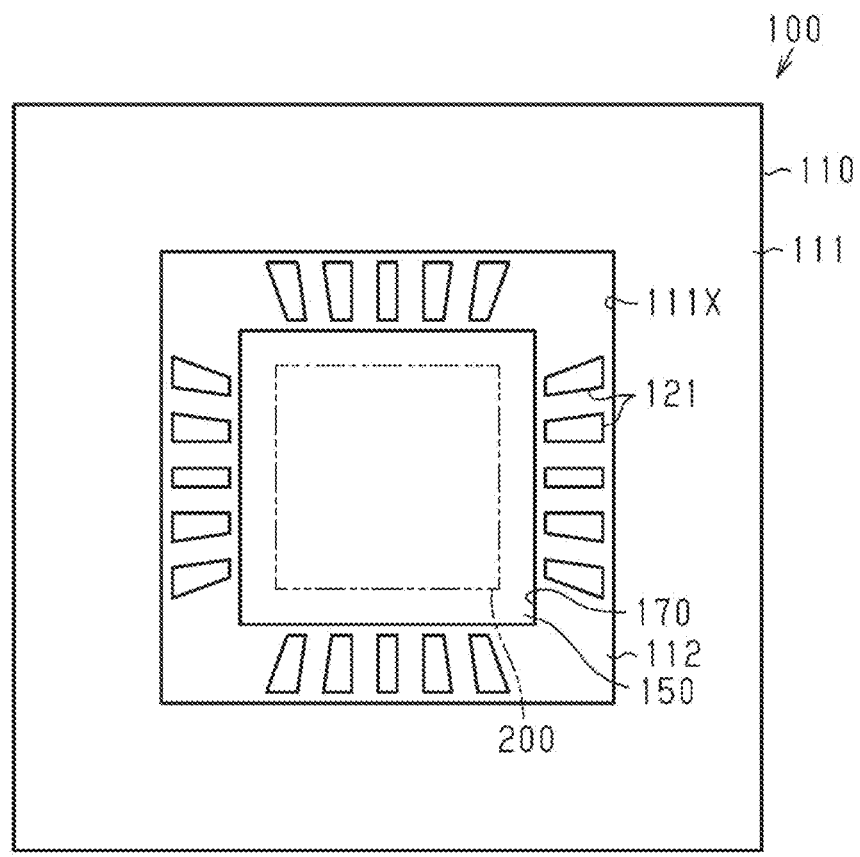
FIG. 22 is a schematic plan view of the package for a semiconductor.

As shown in FIGS. 21 and 22, the ceramic substrate 110 is provided with a cavity 170 penetrating central parts of the ceramic base materials 112, 113 and 114 and formed so as to mount a semiconductor element 200. The wiring pattern 121 is arranged on an upper surface of the ceramic base material 112 so as to surround the cavity 170. The ceramic base material 111 is formed with an opening 111X for exposing the wiring pattern 121.

The ceramic base materials 111 to 114 are of ceramics composed of aluminum oxide, and the wiring patterns 121 to 124 and the vias 132 to 134 are fired bodies having tungsten as a main component and containing nickel oxide, aluminum oxide and silicon dioxide. The ceramic substrate 110 can be manufactured by a manufacturing method similar to the mounting stage 20 of the first embodiment.

In the package 100 for a semiconductor device, the semiconductor element 200 is mounted on the heat dissipation plate 150. Pads of the semiconductor element 200 are electrically connected to the wiring pattern 121 of the ceramic substrate 110 by bonding wires or the like. Thereby, the semiconductor element 200 is connected to the external connection terminals 160 via the wiring patterns 121 to 124 and the vias 132 to 134.

As described above, according to the present embodiment, following effects are realized.

(2-1) In the package 100 for a semiconductor device, similarly to the first embodiment, it is possible to obtain the ceramic substrate 110 including the wiring patterns 121 to 124 without lowering the characteristics of the ceramic base materials 111 to 114 becoming the substrate main body.

(2-2) In the ceramic substrate 110, it is possible to improve the adhesion between the ceramic base materials 111 to 114 and the wiring patterns 121 to 124.

Other Embodiments

The above embodiments can also be changed as follows. The above embodiments and following modified embodiments can be implemented in combination within a technically consistent range.

In the first embodiment, the members included in the electrostatic chuck and the arrangement may also be changed as appropriate.

In the first embodiment, the mounting stage may include only the electrostatic electrode 31, and the heating element 32 may be arranged between the mounting stage and the base plate 10. The heating element 32 may also be provided in the base plate 10. The heating element 32 may also be externally attached below the electrostatic chuck.

The electrostatic chuck of the first embodiment and the modified embodiments is applied to a semiconductor manufacturing apparatus, for example, a dry etching apparatus (for example, a parallel flat plate-type reactive ion etching (RIE) apparatus).

This disclosure further encompasses various exemplary embodiments, for example, described below.

[1] A manufacturing method of an electrostatic chuck comprising a substrate main body and an electrostatic electrode provided inside of the substrate main body, the manufacturing method comprising:

forming a conductor pattern, on an upper surface of a green sheet, by a conductive paste, the green sheet being composed of a mixture of aluminum oxide, which does not contain a sintering agent, and an organic material, the conductive paste in which tungsten is a main component and nickel oxide, aluminum oxide and silicon dioxide are added; and firing the green sheet and the conductor pattern to form the substrate main body and the electrostatic electrode, wherein the substrate main body comprises:

an insulator layer that is ceramics composed of aluminum oxide, and a composite oxide layer of aluminum and silicon formed between the insulator layer and the electrostatic electrode.

[2] The manufacturing method of an electrostatic chuck according to [1], wherein the composite oxide layer is a layer composed of mullite, a layer composed of sillimanite or a layer in which mullite and sillimanite are mixed.

[3] The manufacturing method of an electrostatic chuck according to [1] or [2], wherein in the process of firing the green sheet and the conductor pattern, the green sheet and the conductor pattern are fired at an atmospheric pressure.

[4] The manufacturing method of an electrostatic chuck according to Claim [1] or [2], wherein the composite oxide layer is formed within a range corresponding to additive amounts of aluminum oxide and silicon dioxide added to the conductive paste.

What is claimed is:

1. A ceramic substrate comprising:
a substrate main body; and
a conductor layer provided inside of the substrate main body,
wherein the substrate main body comprises:
an insulator layer that is ceramics composed of aluminum oxide, the conductor layer being provided inside of the insulator layer, and
a composite oxide layer of aluminum and silicon, the composite oxide layer covering the conductor layer so as to be formed between the insulator layer and the conductor layer.

2. The ceramic substrate according to claim 1, wherein the composite oxide layer is a layer composed of mullite, a layer composed of sillimanite or a layer in which mullite and sillimanite are mixed.

3. The ceramic substrate according to claim 1 wherein silicon exists locally in the composite oxide layer.

4. The ceramic substrate according to claim 1, wherein the ceramic substrate has a cavity for mounting a semiconductor device.

5. The ceramic substrate according to claim 1, wherein the composite oxide layer covers an entirety of the conductor layer.

6. An electrostatic chuck comprising:
a substrate main body; and
an electrostatic electrode provided inside of the substrate main body,
wherein the substrate main body comprises:
an insulator layer that is ceramics composed of aluminum oxide, the electrostatic electrode being provided inside of the insulator layer, and
a composite oxide layer of aluminum and silicon, the composite oxide layer covering the electrostatic electrode so as to be formed between the insulator layer and the electrostatic electrode.

7. The electrostatic chuck according to claim 6, wherein the composite oxide layer is a layer composed of mullite, a layer composed of sillimanite or a layer in which mullite and sillimanite are mixed.

8. The electrostatic chuck according to claim 6, wherein silicon exists locally in the composite oxide layer.

9. The electrostatic chuck according to claim 6, wherein the insulator layer has a purity of aluminum oxide of 99.5% or higher.

10. The electrostatic chuck according to claim 6, wherein the insulator layer has a relative density of 98% or higher.

11. The electrostatic chuck according to claim 6 wherein the insulator layer has an average particle diameter of aluminum oxide of 1.0 μm or larger and 3.0 μm or smaller.

12. The electrostatic chuck according to claim 6, wherein the insulator layer and the electrostatic electrode are a fired body formed by co-firing.

13. The electrostatic chuck according to claim 6, wherein the electrostatic electrode is a fired body having tungsten as a main component and containing nickel oxide, aluminum oxide and silicon dioxide.

14. The electrostatic chuck according to claim 6, wherein the electrostatic electrode is a fired body obtained by firing a conductive paste in which an average particle diameter of tungsten is 0.5 μm or larger and 3.0 μm or smaller, and a tungsten component exists locally in the electrostatic electrode.

15. The electrostatic chuck according to claim 6, wherein the electrostatic electrode is a fired body obtained by firing a conductive paste in which an average particle diameter of nickel oxide is 5.0 μm or larger and 15.0 μm or smaller, and nickel exists locally in the electrostatic electrode.

16. The electrostatic chuck according to claim 6, wherein the electrostatic electrode is a fired body obtained by firing a conductive paste in which an average particle diameter of aluminum oxide is 0.1 μm or larger and 4.0 μm or smaller, and aluminum exists in the insulator layer, the electrostatic electrode and the composite oxide layer.

17. The electrostatic chuck according to claim 6, wherein the electrostatic electrode is a fired body obtained by firing a conductive paste in which an average particle diameter of silicon dioxide is 0.1 μm or larger and 12.0 μm or smaller, and silicon exists locally in the electrostatic electrode and the composite oxide layer.

18. The electrostatic chuck according to claim 6, wherein the composite oxide layer has a thickness corresponding to additive amounts of aluminum oxide and silicon dioxide added to a conductive paste for forming the electrostatic electrode.

19. The electrostatic chuck according to claim 6, wherein the composite oxide layer covers an entirety of the electrostatic electrode.

* * * * *